(12) United States Patent
Grandbois et al.

(10) Patent No.: US 9,099,208 B2
(45) Date of Patent: Aug. 4, 2015

(54) ALPHA-PARTICLE EMITTER REMOVAL

(75) Inventors: Matthew L. Grandbois, Midland, MI (US); Harlan Robert Goltz, Midland, MI (US); Jeffrey M. Calvert, Acton, MA (US); Matthew Lawrence Rodgers, Midland, MI (US); Charles R. Marston, Midland, MI (US)

(73) Assignees: Rohm and Haas Electronic Materials LLC; Dow Global Technologies LLC

( * ) Notice: Subject to any disclaimer, the term of this patent is extended or adjusted under 35 U.S.C. 154(b) by 390 days.

(21) Appl. No.: 13/479,409

(22) Filed: May 24, 2012

(65) Prior Publication Data

US 2012/0298586 A1 Nov. 29, 2012

Related U.S. Application Data

(60) Provisional application No. 61/489,251, filed on May 24, 2011.

(51) Int. Cl.

| | | |
|---|---|---|
| *B01D 15/04* | (2006.01) | |
| *G21F 9/00* | (2006.01) | |
| *C22B 3/42* | (2006.01) | |
| *G21F 9/04* | (2006.01) | |
| *G21F 9/12* | (2006.01) | |
| *H01L 23/556* | (2006.01) | |
| *H01L 23/00* | (2006.01) | |

(52) U.S. Cl.
CPC ... *G21F 9/00* (2013.01); *C22B 3/42* (2013.01); *G21F 9/04* (2013.01); *G21F 9/12* (2013.01); *H01L 23/556* (2013.01); *H01L 24/13* (2013.01); *H01L 2224/13111* (2013.01)

(58) Field of Classification Search
CPC ............. C22B 3/42; C22B 25/08; G21F 9/12; H01L 23/556; H01L 2224/13111; H01L 2924/014
USPC ........................ 210/682; 420/557; 428/89, 98
See application file for complete search history.

(56) References Cited

U.S. PATENT DOCUMENTS

| | | | |
|---|---|---|---|
| 4,501,666 A | | 2/1985 | Ogata et al. |
| 4,769,180 A | * | 9/1988 | Echigo et al. ................. 423/7 |
| 4,770,698 A | | 9/1988 | Dunlop et al. |
| 4,887,492 A | | 12/1989 | Dunlop et al. |
| 4,915,802 A | | 4/1990 | Dunlop et al. |
| 5,618,404 A | | 4/1997 | Okuhama et al. |
| 7,083,732 B1 | * | 8/2006 | Chollet et al. ................. 210/670 |
| 7,521,286 B2 | | 4/2009 | Weiser et al. |
| 2002/0153254 A1 | * | 10/2002 | Belongia et al. ............... 205/101 |
| 2004/0065954 A1 | | 4/2004 | Weiser et al. |
| 2009/0039515 A1 | | 2/2009 | Farooq et al. |
| 2009/0056502 A1 | * | 3/2009 | Mendes et al. .................. 75/743 |
| 2009/0098012 A1 | * | 4/2009 | Shindo et al. ................. 420/559 |
| 2010/0140760 A1 | | 6/2010 | Tam et al. |
| 2010/0206133 A1 | | 8/2010 | Weiser et al. |

FOREIGN PATENT DOCUMENTS

| | | | | |
|---|---|---|---|---|
| JP | 63-250485 A | * | 10/1988 | ............... C25D 3/36 |
| JP | S63-250485 | | 10/1988 | |
| JP | 09-015121 | | 1/1997 | |
| JP | 2003-193283 | | 7/2003 | |
| JP | 2007-302496 | | 11/2007 | |
| WO | 2013192065 A1 | | 12/2013 | |

OTHER PUBLICATIONS

English Language Translation of Japanese Unexamined Patent Application Publication S63-250485 to Uchida et al published on Oct. 1988, pp. 469-472.*

Diaion Product Line Brochure, [online]. Mitsubishi Chemical Corporation, Mar. 2011 [retrieved on Jan. 26, 2015]. Retrieved from the Internet: <URL: www.ecochem.com.co/brochures/diaion-catalog-mcc-2011-03.pdf>.*

Clark, et al, "Alpha radiation sources in low alpha materials and implications for low alpha materials refinement", Thin Solid Films, 2004, pp. 384-386, vol. 462.

Vaaramaa et al, "Removal of $^{234,238}$U, $^{226}$Ra, $^{210}$Po and $^{210}$Pb from drinking water by ion exchange", Radiochim. Acta, 2000, pp. 361-367, vol. 88.

Hoffman, et al, "The electrofining and winning of copper", Metallurgical Society of AIME, Copper, Nickel and Precious Metals Committee, 1987, pp. 99-116.

Chinese Patent Office Search report of corresponding Chinese application No. 201210264001.8.

* cited by examiner

*Primary Examiner* — Matthew O Savage

(57) ABSTRACT

Methods of purifying acidic metal solutions by removing at least a portion of alpha-particle emitting materials are provided. The purified metal solutions are useful in a variety of applications requiring low levels of alpha-particle emission.

11 Claims, No Drawings

ALPHA-PARTICLE EMITTER REMOVAL

This application claims the benefit of priority under 35 U.S.C. §119(e) to U.S. Provisional Application No. 61/489,251, filed May 24, 2011, the entire contents of which application are incorporated herein by reference.

The present invention relates to the field of metal compositions having low levels of alpha-particle emitting impurities and to methods of removing alpha-particle emitting impurities from metal compositions.

Many different metals are used in the manufacture of electronic devices. Some of these metals may contain low levels of certain radioactive isotopes that emit alpha-particles ("alpha-particle emitters"). These emitted alpha-particles are capable of causing a change in electrical states, referred to as "soft errors." The errors are referred to as being "soft" because they are not permanent. However, these errors will typically cause at least one round of incorrect calculations. These soft errors are an increasingly large problem for integrated circuit chip fabricators.

While many sources of ionizing radiation exist, the source which is frequently most problematic for semiconductor device packages is solder. Solders are commonly utilized in semiconductor device packaging to attach an integrated circuit ("IC") chip to a package or a substrate. If the solders attaching IC circuitry contain alpha-particle emitters, the alpha-particles are emitted in close proximity to the ICs and can cause damage to packaged semiconductor devices.

The continued miniaturization of IC chip circuitry and increased performance requirements has caused chip fabricators to pay more attention to the effects of ionizing radiation, such as alpha-particles. For example, certain package designs incorporate shielding to protect the IC from alpha-particles. Such shielding is not always effective and it adds to the complexity of the IC chip package. Accordingly, it is desired to reduce the concentration of alpha-particle emitters within the solders.

Lead is a common component of many solders, such as tin-lead alloys. However, one of the lead isotopes (specifically $^{210}$Pb) has a decay chain that leads to alpha-particles. $^{210}$Pb is a member of the uranium decay chain, which is a main contributor of alpha particle emitters as impurities within bulk metal materials (e.g. silver and tin). Further, various common contaminants of lead can emit alpha-particles, including, for example, isotopes of uranium ($^{234,238}$U), thorium ($^{230}$Th), radium ($^{226}$Ra), radon ($^{222}$Rn), polonium ($^{210,218}$Po) and bismuth ($^{211,212}$Bi). The alpha-particle emitters present in lead can be present in the ore from which the lead is initially refined. Alpha-particle emitters can be alternatively, or additionally, introduced during processing and/or use of the lead. For instance, phosphoric acid and some antistatic systems contain alpha-particle emitters; some abrasives and cleaning agents can introduce alpha-particle emitters into lead; and smelting of commercial lead can introduce uranium, thorium and other alpha-particle emitters into the lead from gangue rock.

The amount of alpha-particle emitters present in lead is typically determined by an alpha flux measurement, with results stated in terms of alpha-particle counts per unit area per hour (cts/cm$^2$/hr). It is possible to commercially obtain lead having an alpha flux of from 0.002 to 0.02 cts/cm$^2$/hr, but it is very difficult to obtain a material with a lower alpha flux. However, the semiconductor industry is requesting materials with significantly lower alpha flux, including for example, materials having an alpha flux of less than 0.0001 cts/cm$^2$/hr.

One of the methods which has been utilized for reducing the number of alpha-particle emitters in lead-containing solders is to start with lead materials which contain very few emitters. Presently, there are three sources of such materials: (1) very old lead where the $^{210}$Pb has substantially all decayed; (2) some specific PbS ore bodies which have very little $^{210}$Pb, and which have been carefully refined; and (3) lead which has been subjected to laser isotope separation to remove the $^{210}$Pb isotope from the lead. Various problems exist with all of the sources. For instance, the first source utilizes very old lead, which is often poorly refined and contains various radionuclides as contaminants. The second source typically does not have a sufficiently low alpha-particle emitter concentration to meet the ultimately desired requirements of the semiconductor industry. The third source is very energy intensive to form, and therefore is not commercially feasible.

One method to reduce the concentration of alpha-particle emitters in solder has been to create "lead-free" solders. Suitable lead-free solders may be composed of a variety of metals, such as pure tin, or an alloy such as tin-silver, tin-bismuth, tin-copper, and tin-silver-copper, among others. Such solders contain little, if any, lead, which is desirable from an environmental perspective. However, these lead-free solders may still have an undesirable amount of alpha-particle emitters present as the materials used to make such solders may contain one or more alpha-particle emitters, and may be subjected to acids, antistatic agents, cleaners, abrasives or smelting contaminants that impart alpha-particle emitters.

Attempts have been made to reduce the level of alpha-particle emitting impurities in solder materials. U.S. Pat. No. 7,521,286 purports to reduce the level of alpha-particle emitting materials in a lead-containing material to an alpha flux of less than 0.001 cts/cm$^2$/hr by electrorefining using an aqueous nitric acid bath. Such process is still energy and time intensive and does not address the problem of removing alpha-particle emitting impurities from lead-free solder materials. Japanese Published Patent Application No. 2003-193283 purports to remove alpha-particle emitting impurities from a metal electroplating bath by contacting the electroplating bath with an adsorbant, such as silica gel, then adjusting the pH of the plating bath to be strongly alkaline (pH of 10 to 11) with ammonia, heating the bath in contact with the adsorbant for a period of time to adsorb the alpha-emitting particles on the adsorbant, removing the adsorbant, and then boiling the bath to remove the ammonia and then removing residual ammonia using an ion exchange resin, and then re-acidifying the electroplating bath. This is not a commercially viable process and introduces more possibilities for impurities due to the addition of bases and acids during the process. Accordingly, there remains a need for a relatively simple procedure for removing alpha-particle emitting impurities from metal solutions.

The present invention provides a method for purifying a metal solution comprising: providing an acidic metal solution having an alpha-emitting material; contacting the metal solution with an ion exchange resin for a period of time sufficient to remove at least a portion of the alpha-emitting material; and separating the metal solution from the ion exchange resin to provide a purified metal solution.

In addition, the present invention provides a method of preparing a metal solution comprising: providing an acidic aqueous solution of metal ions; providing an ion exchange resin capable of removing alpha-particle emitting materials; contacting the aqueous solution of metal ions with the ion exchange resin to remove at least a portion of the alpha-particle emitting materials; and then separating the metal solution from the ion exchange resin.

More specifically, the present invention provides a method of preparing a tin solution having a relatively low level of alpha-particle emitters comprising: providing an aqueous solution of tin ions, wherein the solution has a pH of ≤6.9; providing an ion exchange resin capable of removing alpha-particle emitting materials; contacting the aqueous solution of tin ions with the ion exchange resin to remove at least a portion of the alpha-particle emitting materials; and then separating the tin solution from the ion exchange resin.

The terms "alpha-particle emitters," "alpha-particle emitting materials" and "alpha-particle emitting impurities" are used interchangeably. The articles "a" and "an" refer to the singular and the plural. Unless otherwise noted, all amounts are percentages by weight ("wt %") and all ratios are molar ratios. All numerical ranges are inclusive and combinable in any order except where it is clear that such numerical ranges are constrained to add up to 100%.

The present invention uses certain ion exchange resins to selectively remove known alpha-particle emitting impurities from acidic metal solutions, and preferably acidic tin solutions. As used herein, the term "metal solution" refers to a solution of a metal where the metal is present in an amount of ≥0.01 wt %, and preferably in an amount of 0.01 to 30 wt %. When the metal solution is composed of two or more metals such as a tin-silver metal solution, each metal is present in the solution in an amount of ≥0.01 wt %, and preferably 0.01 to 30 wt %. Preferably, the metal used to prepare the metal solution is chosen from tin, lead, silver, copper, bismuth, indium and mixtures thereof, more preferably tin, silver, copper, bismuth, and mixtures thereof, even more preferably tin, silver, copper and mixtures thereof, and most preferably tin. The metal solutions are typically prepared by dissolving an elemental metal such as elemental tin ($Sn^0$), an elemental metal alloy, or a metal salt, such as tin oxide (SnO), in an acid. Mixtures of elemental metals, metal salts or any combination of elemental metals and metal salts may be used. Exemplary mixtures of elemental metals that may be used to prepare the metal solutions include, without limitation, $Sn^0$—$Ag^0$, $Sn^0$—$Ag^0$—$Cu^0$, $Sn^0$—$Bi^0$, and $Sn^0$—$Cu^0$. Any metal salt that dissolves in an acidic aqueous medium may be used in the present process. Exemplary metal salts include, but are not limited to, metal oxides, metal hydroxides, metal halides, metal carboxylates, metal nitrates, and metal nitrites, among others. Metal oxides, metal halides and metal nitrates are preferred metal salts. It is preferred that the metal solution is prepared by dissolving $Sn^0$ or a tin salt in acid. A wide variety of acids may be used, and preferably the acid is a mineral acid or an organic sulfonic acid, with organic sulfonic acids being preferred. Preferred mineral acids include, without limitation, hydrohalogen acids, nitric acid, and sulfuric acid. Hydrohalogen acids are the more preferred mineral acid, and hydrochloric acid is even more preferred. Preferred organic sulfonic acids are alkane sulfonic acids and aryl sulfonic acids. Particularly preferred organic sulfonic acids include, but are not limited to, methane sulfonic acid, ethane sulfonic acid, propane sulfonic acid, benzene sulfonic acid, p-toluene sulfonic acid, and phenol sulfonic acid.

As used herein, the term "acidic metal solution" refers to a metal solution having a pH value of ≤6.9, and preferably ≤6.5. It is more preferred that the pH of the metal solution is in the range of 0 to 6.5. For example, when the metal solution is a tin solution prepared by dissolving elemental tin in aqueous hydrochloric acid, it is preferred that the pH is ≤3.5, more preferably ≤2, even more preferably ≤1.5, and still more preferably ≤0.5. Alternatively, when the metal solution is a tin solution prepared by dissolving tin oxide (SnO) in aqueous organic sulfonic acid, such as methane sulfonic acid, it is preferred that the pH is in the range of 4 to 6.9, more preferably 4.5 to 6.5, and even more preferably 5 to 6.5. For the present process to be effective in removing alpha-particle emitters, the metal solution should be homogeneous, that is, it should be free of precipitate or dispersed solid.

The present metal solutions are contacted with certain ion exchange resins to remove at least a portion of alpha-particle emitting impurities contained in the solution. Suitable ion exchange resins are those capable of removing alpha-particle emitting materials. Particular ion exchange resins are chelation resins, anion exchange resins, cation exchange resins, titania-based adsorbing reins and mixtures thereof. Preferred ion exchange resins are iminodiacetic acid resins, nitrilotriacetic acid resins, phosphinoacetic acid resins, thiourea resins, picolylamine resins, quaternary amine resins, tertiary amine resins, aromatic amine resins, thiol resins, sulfonated phenol resins, titania-based adsorbing resins and mixtures thereof. Particularly preferred ion exchange resins are iminodiacetic acid resins, thiourea resins, quaternary amine resins, thiol resins, titania-based adsorbing resins and mixtures thereof. Certain ion exchange resins, such as quaternary amine resins such as DOWEX 21k XLT resin (available from The Dow Chemical Company), are particularly useful at removing uranium such as $^{234,238}U$. Other ion exchange resins which are useful in removing lead ($^{210}Pb$), polonium ($^{210,218}Po$), bismuth ($^{211,212}Bi$) include: quaternary amine ion exchange resins such as those sold under the XZ-91419 and DOWEX PSR-2 product names; thiourea based resins sold under the XUS-43600 product name; thiol based resin sold under the AMBERSEP GT-74 product name; iminodiacetic acid based resin sold under the AMBERLITE IRC748i product name; and triethylammonium resin sold under the AMBERLITE PWA5 product name, all available from The Dow Chemical Company (Midland, Mich.).

The metal solutions may be contacted with the ion exchange resins at a wide range of temperatures. Typically, the metal solution may be contacted with the ion exchange resin at a temperature in the range of 15 to 90° C., preferably in the range of 20 to 80° C., and more preferably 25 to 80° C. The metal solutions and the ion exchange resins are contacted for a period of time sufficient to at least partially remove one or more alpha-particle emitting impurities. In general, the contact time may vary from a few minutes to several days, preferably from 15 minutes to 72 hours, more preferably from 30 minutes to 72 hours, and even more preferably from 1 hour to 72 hours.

In use, a quantity of ion exchange resin may be added to a quantity of metal solution in a vessel (batch process). The mixture may optionally be stirred or agitated. Alternatively, the metal solution may be contacted with the ion exchange resin by passing the metal solution through a column containing the ion exchange resin. The metal solution may be added to the top of an ion exchange column as a single batch, or alternatively, an ion exchange column may be used in a continuous process for removing alpha-particle emitters. The design of such ion exchange column is well within the ability of those skilled in the art. It will be appreciated that a single ion exchange resin ("single bed") may be used, or a mixture of different ion exchanges resins ("mixed bed") may be used in the present process, in either a batch or in an ion exchange column. In one example, a mixture of quaternary amine resins such as DOWEX 21k XLT resin and one or more of: quaternary amine ion exchange resins such as those sold under the DOWEX PSR-2 and XZ-91419 product names; thiourea based resins sold under the XUS-43600 product name; thiol based resin sold under the AMBERSEP GT-74 product name; iminodiacetic acid based resin sold under the AMBERLITE IRC748i product name; and triethylammonium resin sold under the AMBERLITE PWA5 product name is used. Such resins may be mixed together (mixed bed) and added to the vessel containing the metal solution or, alternatively, the metal solution may be passed through a column containing such mixture. In a further alternative, 2 or more different resins may be used sequentially. For example, in a batch process, a first resin may be contacted with the metal solution, and then following removal of the metal solution from the first resin, the metal solution may then be contacted with a second resin. Likewise, in a continuous process, the metal solution may be passed through a first column containing a first ion exchange resin, and then taking the eluent and passing it through a second column containing a second ion exchange resin. Using 2 or more resins, either together or sequentially, allows the selection of ion exchange resins to maximize the removal of the alpha-particle emitters from the metal solutions.

The amount of ion exchange resin used is not critical and the specific amount is well within the ability of one skilled in the art. In general, the amount of ion exchange resin used is from 0.25 to 30 wt %, based on the weight of the metal in solution, preferably from 0.5 to 25 wt %, and more preferably from 1 to 20 wt %.

After removing at least a portion of alpha-particle emitting material, the metal solution is removed from contact with the ion exchange resin. In a batch process, the metal solution may be removed from contact with the resin by filtration, decantation, or other suitable means. When an ion exchange column is used, the metal solution is collected as the eluent from the column. The collected metal solution may be used as is or the metal may be isolated from the solution as its salt by a variety of techniques known in the art. Following contact with the ion exchange resin, the metal solution has a reduced level of alpha-particle emitters as compared to the metal solution before contact with the ion exchange resin. Any metal salt isolated from the metal solution will consequently also have a reduced level of alpha-particle emitters as compared to the metal or metal salt before being purified by the present process. In general, ion exchange resin treatment of the metal solution provides ≥5 wt % reduction in the level of alpha-particle emitters, preferably ≥8 wt %, more preferably ≥10 wt %, still more preferably ≥12 wt %, yet more preferably ≥15 wt %, and even more preferably ≥20 wt %.

The ion exchange resins suitable for use in the present process are capable of removing one or more alpha-particle emitting materials. In particular, such resins are capable of removing one or more radionuclides within the uranium decay chain that are known alpha particle emitters, such as $^{234,238}U$, $^{230}Th$, $^{226}Ra$, $^{222}Rn$, $^{210,218}Po$, $^{210}Pb$, and $^{211,212}Bi$. Preferably, the present process removes $^{210,218}Po$, $^{210}Pb$, and $^{211,212}Bi$, and more preferably $^{210}Pb$, and $^{211,212}Bi$ from the metal solution. Secular equilibrium (that is, replacement of one radioactive isotope with its precursor isotope) mechanisms are present at several stages of the uranium decay cycle and lead to a "steady-state" of alpha-particle emitting impurities within metals. As an example, $^{210}Po$ is gradually replaced as $^{210}Pb$ decays during the course of the decay chain. This phenomenon makes the selective removal of just one impurity element inadequate for the lowering of alpha-particle flux. Instead, a block of closely related elements within a decay chain must be removed to effectively lower the alpha-particle flux within the desired materials. The present invention achieves this result by being able to remove at least a portion of the members of the secular equilibrium in the uranium decay chain, specifically uranium, thorium, radium, radon, polonium, bismuth, and lead, preferably uranium, thorium, radium, polonium, bismuth, and lead, more preferably polonium, bismuth, and lead, and yet more preferably bismuth and lead. The present invention is effective at reducing the level of alpha-particle emitters, and specifically at reducing the level of alpha-particle emitters in tin, by selectively removing polonium, bismuth, and lead from bulk materials such as $SnCl_2$ and $SnO$.

The process of the present invention provides metal solutions, and particularly tin-containing metal solutions, and metal salts obtained from such solutions that have reduced levels of alpha-particle emitters. Such metal solutions, and metal salts obtained from such solutions, are useful in a variety of electronics-related applications, such as in solders. In electronics applications such as in packaging applications, solders may be used in the form of solder bumps, solder balls, pillars or columns. In each case, when the present metal solutions or obtained metal salts are used to prepare such solders, the resulting solders also have a reduced level of alpha-particle emitters.

The present process can be used to prepare metal salts, particularly tin salts, having reduced levels of alpha-particle emitters. It is preferred that tin salts having reduced levels of alpha-particle emitters be prepared according to the present process. For example, elemental tin can be dissolved in aqueous HCl and purified according to the present process, after which, $SnCl_2$ having reduced levels of alpha-particle emitters can be isolated from the metal solution. Alternatively, commercially available $SnCl_2$ may be dissolved in a suitable acid, such as aqueous HCl and purified according to the present process, after which, $SnCl_2$ having reduced levels of alpha-particle emitters can be isolated from the metal solution. In addition, the present process provides for the production of $SnO$ having reduced levels of alpha-particle emitters. Such $SnO$ may be prepared by dissolving elemental tin, or other suitable tin salt, in an aqueous acid, such as aqueous HCl, contacting the metal solution with an ion exchange resin according to the present process, and then adding sufficient appropriate base to form $SnO$, which can be isolated from the now alkaline solution. Such $SnO$ is particularly useful as the source of tin ions in tin-based solder electroplating baths, such as tin, tin-sliver, tin-silver-copper and tin-bismuth electroplating baths.

It is preferred that the metal solutions treated according to the present process show a reduction of ≥5% in the alpha-particle counts per unit area per hour (cts/cm$^2$/hr) after such treatment, preferably ≥10%, more preferably ≥20%, still more preferably ≥25%, and yet more preferably ≥30% reduction in the alpha-particle counts per unit area per hour as compared to the metal solution before such treatment.

EXAMPLES

The following Table 1 lists the ion exchange resins are used in the following examples. All ion exchange resins were obtained from The Dow Chemical Company, Midland, Mich. In the following tables, the abbreviations have the following meanings: N/A=not applicable; ND=not detectable; DVB=divinylbenzene; Quat.=quaternary; SB=strong base; WB=weak base; and WA=weak acid.

TABLE 1

| Resin | Description/Functional Group | Exchange mechanism | Matrix |
|---|---|---|---|
| XUS-43604 | thiol | Cation exchange | N/A |
| Dowex Adsorbsia As500 | $TiO_2$ particle | Adsorbent | titanium oxide |
| Dowex PSR-2 | Quat. amine | Tri-n-butylamine | Styrene-DVB, gel |
| Dowex Optipore SD-2 | Tertiary amine | WB Adsorbent | Styrene-DVB, macroporous |
| Amberlite PWA5 | SB anion, $NO_3^-$ selective | Anion exchange | Cross-linked copolymer |
| Dowex MAC-3 | Carboxylic acid | WA cation exchange | Polyacrylic, macroporous |
| Amberlite IRC747 | Amino-phosphate; Na+ form | Chelating | Styrene divinylbenzene copolymer |
| Amberlite IRC748i | Iminodiacetic acid; Na+ form | Chelating | Styrene-DVB, macroporous |
| Ambersep GT-74 | Thiol | Cation exchange | Macroporous styrene copolymer |
| XUS-43578 | Bis-picolylamine | Chelating | Styrene-DVB, macroporous |
| XUS-43600 | Thiouronium | Chelating | Styrene-DVB, macroporous |
| Dowex 21k XLT | Quat amine | SB anion exchange | Styrene-DVB, gel |
| XZ-91419 | Quat amine | SB anion exchange | Styrene-DVB, gel |

Example 1

Extreme Low pH. Tin metal (150 g) was dissolved in aqueous hydrochloric acid (20% w/w, 1.1 L). The resulting homogenous solution was divided into 100 mL aliquots. The pH of the solution was <0.01. Each aliquot was charged with ion exchange resin (1.5 g) and allowed to equilibrate for seven days. Following equilibration, the solution was decanted from the mixture and analyzed via ion-couple plasma mass spectrometry (ICP-MS) for lead, polonium and bismuth. These results are reported in Table 2.

TABLE 2

| Sample | Resin | Pb (ppm) | Bi (ppm) | Po (ppm) | % Change Pb | % Change Bi |
|---|---|---|---|---|---|---|
| Control | None | 45.48 | 2.26 | ND | — | — |
| C-1 | XUS-43604 | 44.67 | 2.25 | ND | −1.8 | 0 |
| C-2 | DOWEX PSR-2 | 49.12 | 2.46 | ND | 8.0 | 8.8 |
| C-3 | DOWEX OPTIPORE SD-2 | 46.2 | 2.33 | ND | 1.6 | 3.1 |
| C-4 | AMBERLITE PWA5 | 43.77 | 2.19 | ND | −3.8 | −3.1 |
| C-5 | DOWEX MAC-3 | 44.78 | 2.23 | ND | −1.5 | −1.3 |
| C-6 | AMBERLITE IRC747 | 44.68 | 2.2 | ND | −1.8 | −2.7 |
| C-7 | XUS-43578 | 47.17 | 2.38 | ND | 3.7 | 5.3 |
| C-8 | XUS-43600 | 43.84 | 2.22 | ND | −3.6 | −1.8 |
| C-9 | DOWEX 21k XLT | 43.82 | 2.19 | ND | −3.6 | −3.1 |
| C-10 | XZ-91419 | 44.35 | 2.24 | ND | −2.5 | −0.9 |
| C-11 | DOWEX ADSORBISIA AS500 | 44.7 | 2.25 | ND | −1.7 | −0.4 |
| 1 | AMBERLITE IRC748i | 39.92 | 2 | ND | −12.2 | −11.5 |
| 2 | AMBERSEP GT-74 | 43.88 | 2.01 | ND | −3.5 | −11.1 |

The detection limit of Po was 1 ppm. The Control sample is a sample of the tin solution as prepared, before contact with any of the resins. In Table 2, a positive % change indicates that the level of impurity actually increased, whereas a negative % change indicates a reduction in the level of the impurity. The % change was measured against the level of the impurities in the Control. Samples C-1 to C-11 are comparative samples.

Samples 1 and 2 are inventive samples. In this extremely low pH system, a resin was considered to pass when it removed ≥5% of an impurity.

Example 2

Low pH example. Tin metal (150 g) was dissolved in aqueous hydrochloric acid (20% w/w, 1.1 L). The resulting solution was titrated with aqueous caustic soda (10% w/w) until a white precipitate was formed. The solution was then back-titrated with hydrochloric acid until the solid was dissolved back into solution. The pH of the resulting solution was 1.0. The resulting homogenous solution was divided into 100 mL aliquots. Each aliquot was charged with ion exchange resin (1.5 g) and allowed to equilibrate for seven days. During the course of the equilibration, a tin hydroxide species precipitated from the system. Following equilibration, the clear solution was decanted from the mixture and analyzed via ICP-MS for Pb, Bi and Po impurities. The results reported in Table 3. An aliquot of the mixed slurry was analyzed and was found to have substantially identical results to the solution.

TABLE 3

| Sample | Resin | Pb (ppm) | Bi (ppm) | Po (ppm) | % Change Pb | % Change Bi |
|---|---|---|---|---|---|---|
| Control | None | 20 | 0.33 | ND | — | — |
| C-1 | XUS-43604 | 16 | 0.31 | ND | −20 | 0 |
| C-2 | DOWEX PSR-2 | 17 | 0.36 | ND | −15 | 10 |
| C-3 | DOWEX OPTIPORE SD-2 | 17 | 0.31 | ND | −15 | 0 |
| C-4 | AMBERLITE PWA5 | 17 | 0.31 | ND | −15 | 0 |
| C-5 | DOWEX MAC-3 | 17 | 0.33 | ND | −15 | 0 |
| C-6 | AMBERLITE IRC747 | 17 | 0.31 | ND | −15 | 0 |
| C-7 | AMBERLITE IRC748i | 17 | 0.31 | ND | −15 | 0 |
| C-8 | XUS-43578 | 17 | 0.28 | ND | −15 | −15 |
| C-9 | DOWEX 21k XLT | 17 | 0.33 | ND | −15 | 0 |
| C-10 | XZ-91419 | 17 | 0.32 | ND | −15 | −3 |
| 1 | AMBERSEP GT-74 | 17 | ND | ND | −15 | −100 |

TABLE 3-continued

| Sample | Resin | Pb (ppm) | Bi (ppm) | Po (ppm) | % Change Pb | % Change Bi |
|---|---|---|---|---|---|---|
| 2 | DOWEX ADSORBISIA AS500 | 16 | 0.16 | ND | −20 | −52 |
| 3 | XUS-43600 | 16 | ND | ND | −20 | −100 |

The detection limit of both Bi and Po was 1 ppm. The Control sample is a sample of the tin solution as prepared, before contact with any of the resins. In Table 3, a positive % change indicates that the level of impurity actually increased, whereas a negative % change indicates a reduction in the level of the impurity. The % change was measured against the level of the impurities in the Control. Samples C-1 to C-10 are comparative samples. Samples 1 to 3 are inventive samples. In this low pH system, a resin was considered to pass when it removed >15% of each of Bi and Pb.

Example 3

Mildly acidic pH. Stannous oxide (239 g) was dissolved in a solution containing methanesulfonic acid (70%, 542 g) and water (80 g). The pH of the solution was 5.5 to 6.35. The resulting clear, colorless solution was divided into several aliquots and each aliquot was charged with a separate ion exchange resin. The separate solutions were allowed to equilibrate for seven days, after which the liquid was decanted from the mixture and analyzed via ICP-MS for Pb, Bi and Po impurities. These results are reported in Table 4.

TABLE 4

| Sample | Resin | Pb (ppm) | Bi (ppm) | Po (ppm) | % Change Pb | % Change Bi |
|---|---|---|---|---|---|---|
| Control | None | 99 | 2.2 | ND | — | — |
| C-1 | DOWEX MAC-3 | 98 | 2.1 | ND | −1.0 | −4.5 |
| C-2 | DOWEX OPTIPORE SD-2 | 103 | 2.3 | ND | 4.0 | 4.5 |
| C-3 | XUS-43578 | 98 | 2.1 | ND | −1.0 | −4.5 |
| C-4 | AMBERLITE IRC747 | 99 | 2.1 | ND | 0 | −4.5 |
| C-5 | DOWEX 21k XLT | 100 | 2.2 | ND | 1.0 | 0 |
| C-6 | XUS-43604 | 105 | 2.2 | ND | 6.1 | 0 |
| 1 | AMBERSEP GT-74 | 92 | ND | ND | −7.1 | >−55 |
| 2 | AMBERLITE IRC748i | 98 | 2 | ND | −1.0 | −9.1 |
| 3 | AMBERLITE PWA5 | 71 | 1.5 | ND | −28.3 | −31.8 |
| 4 | XUS-43600 | 98 | ND | ND | −1.0 | >−55 |
| 5 | DOWEX PSR-2 | 68 | 1.5 | ND | −31.3 | −31.8 |
| 6 | DOWEX ADSORBISIA AS500 | 61 | 1.2 | ND | −38.4 | −45.5 |
| 7 | XZ-91419 | 94 | 2.0 | ND | −5.1 | −9.1 |

The detection limit of Bi was 1 ppm and Po was 5 ppm. The Control sample is a sample of the tin solution as prepared, before contact with any of the resins. In Table 4, a positive % change indicates that the level of impurity actually increased, whereas a negative % change indicates a reduction in the level of the impurity. The % change was measured against the level of the impurities in the Control. Samples C-1 to C-6 are comparative samples. Samples 1 to 7 are inventive samples. In this mildly acidic system, a resin was considered to pass when it removed >5% of an impurity.

What is claimed is:

1. A method for purifying a tin solution comprising: providing an acidic tin solution having an alpha-emitting material comprising one or more of $^{210}$Pb, $^{211}$Bi and $^{212}$Bi; contacting the tin solution with an ion exchange resin for a period of time sufficient to remove at least a portion of the alpha-emitting material comprising one or more of $^{210}$Pb, $^{211}$Bi and $^{212}$Bi; and separating the tin solution from the ion exchange resin to provide a purified tin solution; wherein the ion exchange resin is chosen from one or more of iminodiacetic acid resins, nitrilotriacetic acid resins, phosphinoacetic acid resins, thiourea resins, picolylamine resins, quaternary amine resins, tertiary amine resins, aromatic amine resins, thiol resins, and sulfonated phenol resins.

2. The method of claim 1 wherein the acidic tin solution has a pH value of <6.9.

3. The method of claim 1 wherein the acidic tin solution comprises an organic sulfonic acid.

4. The method of claim 1 wherein the step of contacting the tin solution with the ion exchange resin is performed at a temperature of 15 to 90° C.

5. The method of claim 1 wherein the tin is present in an amount of 0.01 to 30 wt %.

6. The method of claim 1 wherein two ion exchange resins chosen from iminodiacetic acid resins, nitrilotriacetic acid resins, phosphinoacetic acid resins, thiourea resins, picolylamine resins, quaternary amine resins, tertiary amine resins, aromatic amine resins, thiol resins and sulfonated phenol resins are used.

7. The method of claim 6 wherein the two ion exchange resins are a mixed bed resin.

8. The method of claim 7 wherein the mixed bed resin comprises a mixture of a quaternary amine resin and one or more of: thiourea resins, thiol resins, and iminodiacetic acid resins.

9. The method of claim 6 wherein the tin solution contacts the two ion exchange resins sequentially.

10. The method of claim 1 wherein the step of contacting the tin solution with the ion exchange resin is a continuous process.

11. The method of claim 1 wherein the step of contacting the tin solution with the ion exchange resin is a batch process.

* * * * *